United States Patent
JangJian et al.

(10) Patent No.: US 9,041,140 B2
(45) Date of Patent: May 26, 2015

(54) GRIDS IN BACKSIDE ILLUMINATION IMAGE SENSOR CHIPS AND METHODS FOR FORMING THE SAME

(75) Inventors: Shiu-Ko JangJian, Tainan (TW); Min Hao Hong, Kaohsiung (TW); Ting-Chun Wang, Tainan (TW); Chung-Ren Sun, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 268 days.

(21) Appl. No.: 13/420,847

(22) Filed: Mar. 15, 2012

(65) Prior Publication Data

US 2013/0241018 A1 Sep. 19, 2013

(51) Int. Cl.
*H01L 31/18* (2006.01)
*H01L 27/146* (2006.01)

(52) U.S. Cl.
CPC .... *H01L 27/14621* (2013.01); *H01L 27/14625* (2013.01); *H01L 27/14627* (2013.01); *H01L 27/14629* (2013.01); *H01L 27/1464* (2013.01)

(58) Field of Classification Search
USPC .................... 257/459, 460; 438/98
See application file for complete search history.

(56) References Cited

U.S. PATENT DOCUMENTS

| | | | |
|---|---|---|---|
| 2004/0057117 A1* | 3/2004 | Hodge et al. | 359/614 |
| 2006/0049476 A1* | 3/2006 | Koizumi et al. | 257/432 |
| 2006/0192083 A1* | 8/2006 | Fu et al. | 250/214.1 |
| 2008/0198454 A1* | 8/2008 | Wang et al. | 359/486 |
| 2009/0101192 A1* | 4/2009 | Kothari et al. | 136/246 |
| 2010/0110271 A1 | 5/2010 | Yanagita et al. | |
| 2011/0019050 A1* | 1/2011 | Yamashita | 348/308 |

FOREIGN PATENT DOCUMENTS

KR 20030038838 5/2003

* cited by examiner

*Primary Examiner* — Zandra Smith
*Assistant Examiner* — Jaehwan Oh
(74) *Attorney, Agent, or Firm* — Slater & Matsil, LLP

(57) ABSTRACT

A device includes a semiconductor substrate having a front side and a backside, a photo-sensitive device disposed on the front side of the semiconductor substrate, and a first and a second grid line parallel to each other. The first and the second grid lines are on the backside of, and overlying, the semiconductor substrate. The device further includes an adhesion layer, a metal oxide layer over the adhesion layer, and a high-refractive index layer over the metal layer. The adhesion layer, the metal oxide layer, and the high-refractive index layer are substantially conformal, and extend on top surfaces and sidewalls of the first and the second grid lines.

19 Claims, 8 Drawing Sheets

GRIDS IN BACKSIDE ILLUMINATION IMAGE SENSOR CHIPS AND METHODS FOR FORMING THE SAME

BACKGROUND

Backside Illumination (BSI) image sensor chips are replacing front-side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip.

The image sensors in the BSI image sensor chips generate electrical signals in response to the stimulation of photons. The magnitudes of the electrical signals (such as the currents) depend on the intensity of the incident light received by the respective image sensors. To reduce the optical cross-talks of the light received by different image sensors, metal grids are formed to isolate the light. To maximize the quantum efficiency of image sensors, it is desirable that the light loss and optical cross-talk are minimized.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A grid structure in a Backside Illumination (BSI) image sensor chip and the methods of forming the same are provided in accordance with various exemplary embodiments. The intermediate stages of forming the grid structure are illustrated. The variations of the embodiments are discussed. Throughout the various views and illustrative embodiments, like reference numbers are used to designate like elements.

Figure 1:
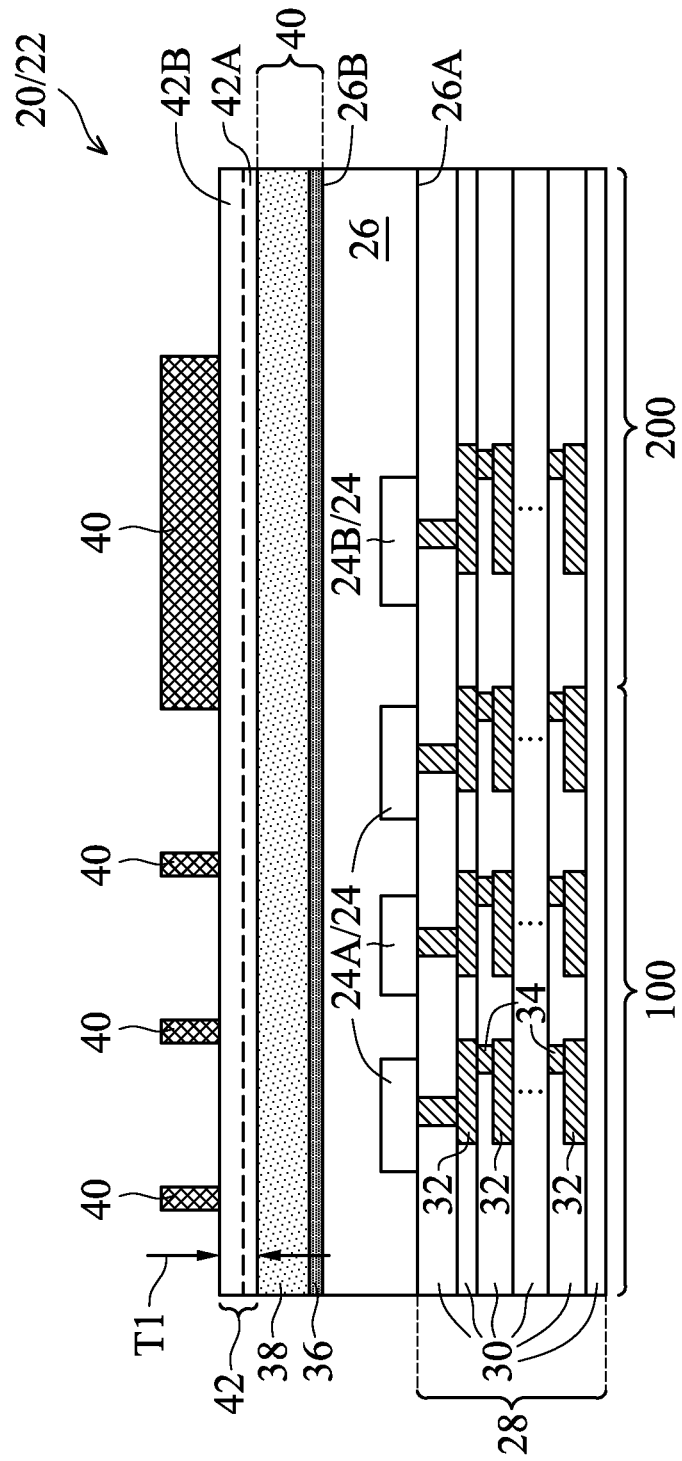
FIGS. 1 through 6 are cross-sectional views and a top view of intermediate stages in the manufacturing of a grid structure in a Backside Illumination (BSI) image sensor chip in accordance with some exemplary embodiments.

FIGS. 1 through 6 illustrate the cross-sectional views and a top view of intermediate stages in the manufacturing of a grid structure in accordance with some exemplary embodiments. FIG. 1 illustrates image sensor chip 20, which may be a part of an un-sawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 (including 24A and 24B) are formed at surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, the respective wafer 22 may be an image sensor wafer. In some exemplary embodiments, image sensors 24 extend from front surface 26A into semiconductor substrate 26. The structures of image sensors 24A and 24B may be identical to each other.

Front-side interconnect structure 28 is formed over semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, the metal lines 32 in a same dielectric layer 30 are collectively referred to as being a metal layer. Front-side interconnect structure 28 may include a plurality of metal layers. In some exemplary embodiments, dielectric layers 30 include low-k dielectric layers and passivation layers. The low-k dielectric layers have low k values, for example, lower than about 3.0. The passivation layers may be formed of non-low-k dielectric materials having k values greater than 3.9. In some embodiments, the passivation layers include a silicon oxide layer and a silicon nitride layer on the silicon oxide layer.

Image sensor chip 20 includes active image sensor pixel region 100 and black reference pixel region 200. Active image sensor pixel region 100 includes active image sensors 24A formed therein, which are used for generating electrical signals from the sensed light. Image sensors 24A may form an active image sensor pixel array including a plurality of image sensors arranged as rows and columns. Black reference pixel region 200 includes black reference image sensor 24B formed therein, which is used for generating reference black level signals. Although one image sensor 24B is illustrated, there may be a plurality of image sensors 24B.

A backside grinding is performed to thin semiconductor substrate 26, and the thickness of wafer 22 is reduced to smaller than about 30 μm, or smaller than about 5 μm, for example. With semiconductor substrate 26 having a small thickness, light can penetrate from back surface 26B into semiconductor substrate 26, and reach image sensors 24A.

After the step of thinning, buffer layers 40 are formed on the surface of semiconductor substrate 26. In some exemplary embodiments, buffer layers 40 include Bottom Anti-Reflective Coating (BARC) 36, and silicon oxide layer 38 over BARC layer 36. In some embodiments, silicon oxide layer 38 is formed using Plasma Enhanced Chemical Vapor Deposition (PECVD), and hence is referred to as Plasma Enhanced (PE) oxide layer 38. It is appreciated that buffer layers 40 may have different structures, formed of different materials, and/or have different number of layers other than illustrated.

Metal layer 42 is formed over buffer layers 40. In some embodiments, metal layer 42 includes a metal(s) or a metal alloy, wherein the metals in metal layer 42 may include tungsten, aluminum, copper, and/or the like. Thickness T1 of metal layer 42 may be greater than about 500 Å, for example. It is appreciated that the dimensions recited throughout the description are merely examples, and may be changed to different values. Photo resist 44 is formed over metal layer 42, and is then patterned. Metal layer 42 may have a single-layer structure with a single layer therein, or may have a composite structure including a plurality of stacked layers. In some exemplary embodiments, metal layer 42 includes layer 42A, and layer 42B over layer 42A, Layer 42A may be a metal nitride layer such as a titanium nitride, layer, a tantalum nitride layer, or the like, and layer 42B may comprises tungsten, aluminum, copper, and/or the like.

Figure 2:
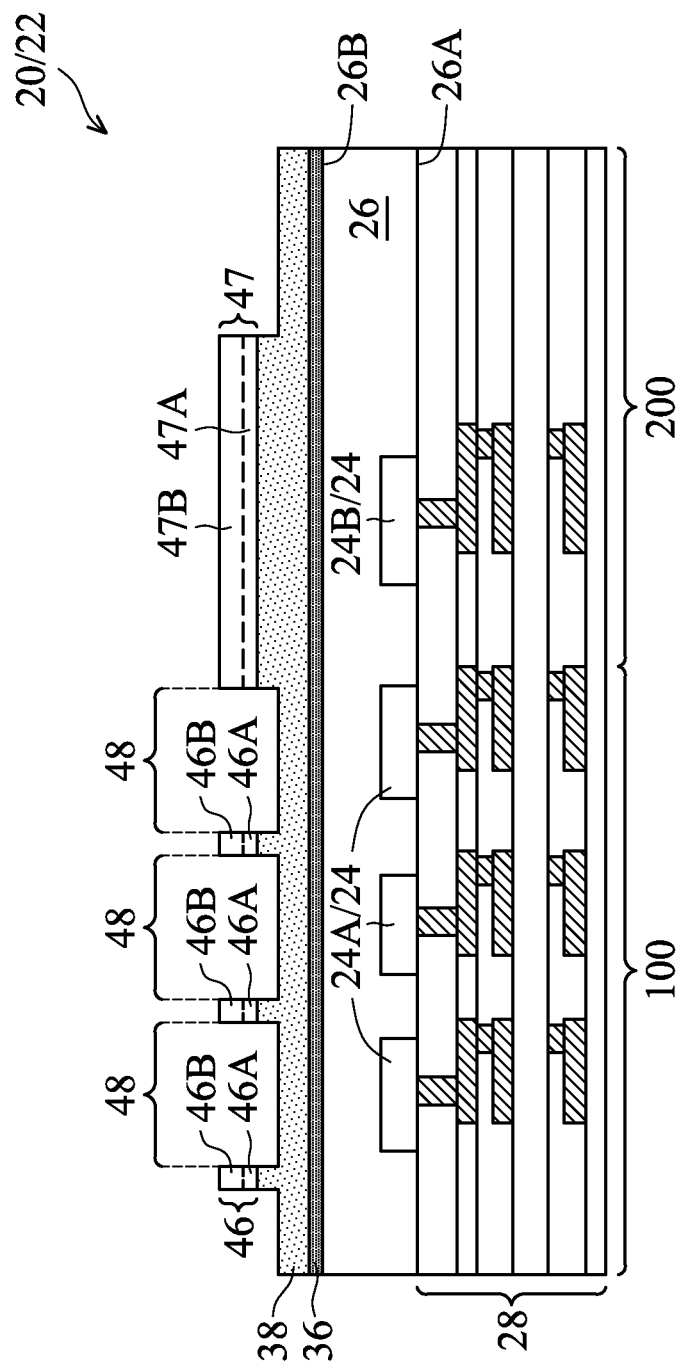

The patterned photo resist 44 is used as an etching mask to etch through metal layer 42. Referring to FIG. 2, the remaining portions of metal layer 42 include a metal grid, which includes metal grid lines 46 that have lengthwise directions parallel to surface 26A of substrate 26. Grid lines 46 include a first plurality of grid lines parallel to each other, and a second plurality of grid lines parallel to each other. The first plurality of grid lines is perpendicular to the second plurality of grid lines 46 to form the grids. Grid openings 48 are formed between grid lines 46. Each of grid openings 48 may be over and aligned to one of active image sensors 24A. The patterned metal layer 42 further includes portion 47 overlapping black reference image sensor 24B. Portion 47 is referred to as metal shield 47 hereinafter. In the embodiments wherein metal layer 42 is a composite layer, each of grid lines 46 includes layer 46A and layer 46B over layer 46A, which are the remaining portions of layers 42A and 42B, respectively. Metal shield 47 also includes layer 47A and layer 47B over layer 47A, which are also the remaining portions of layers 42A and 42B, respectively.

Figure 3:
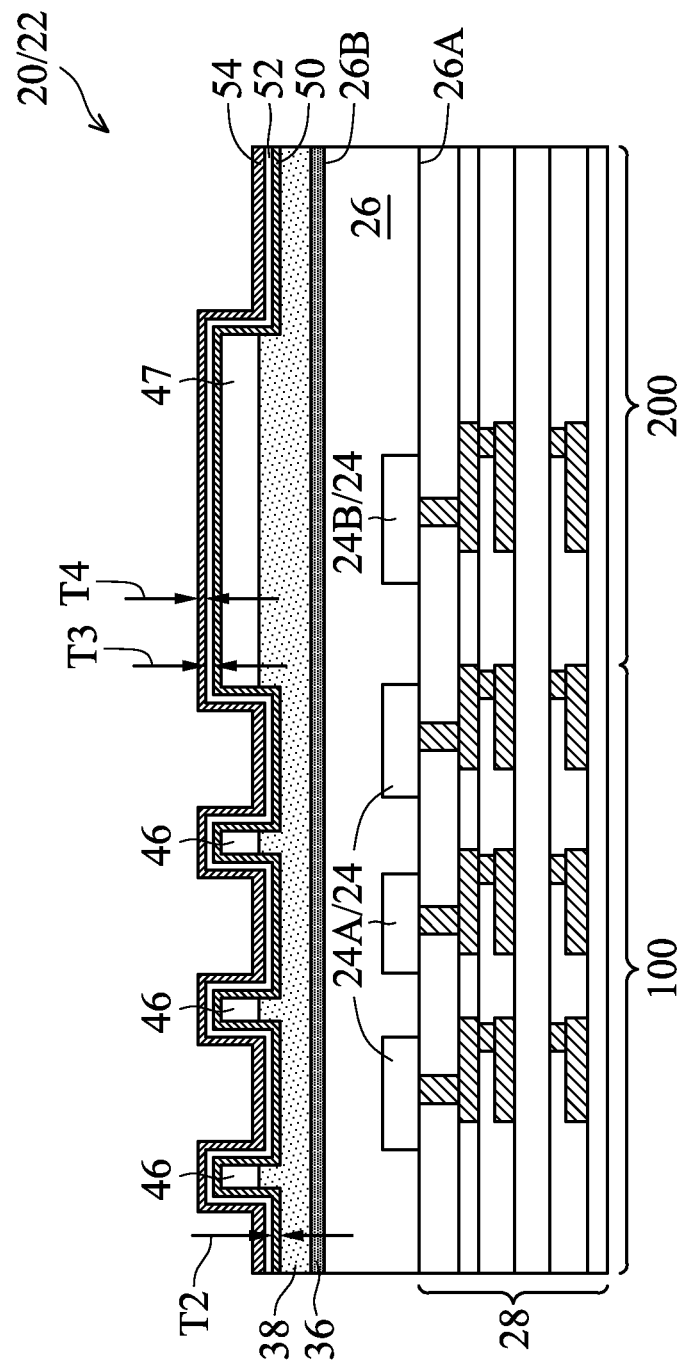
Figure 4A:
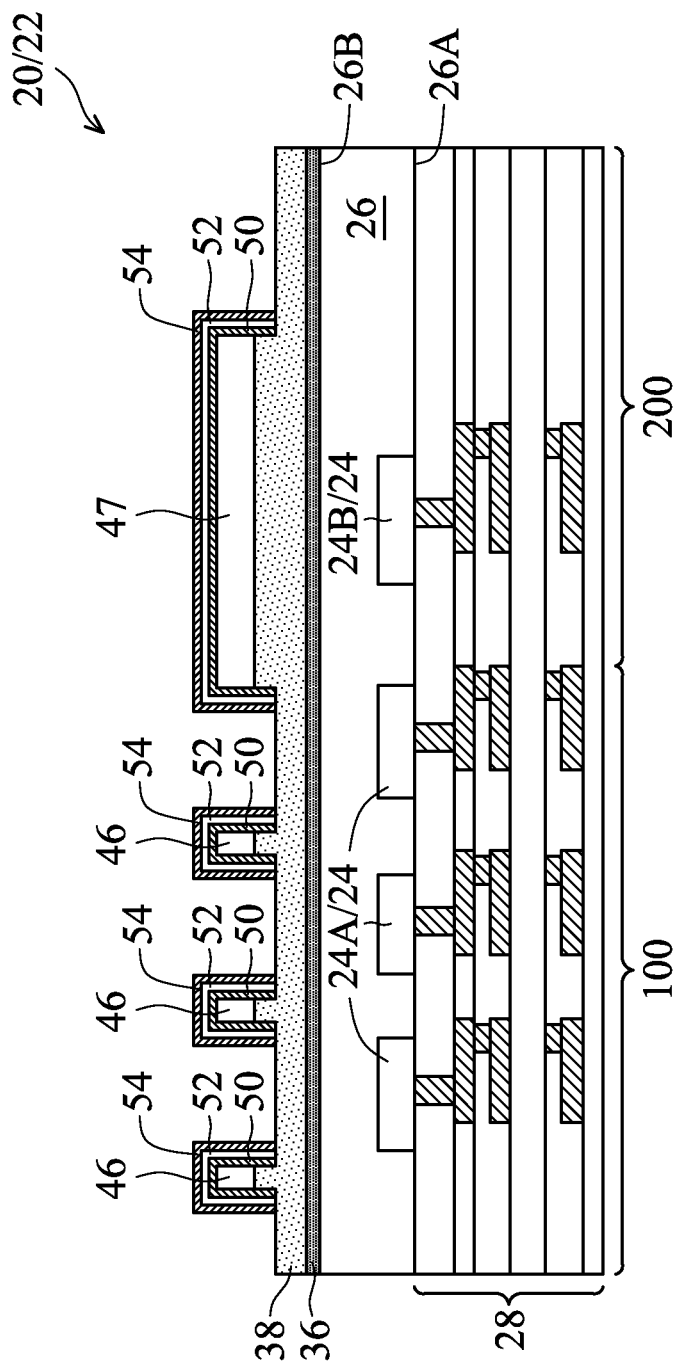
Figure 4B:
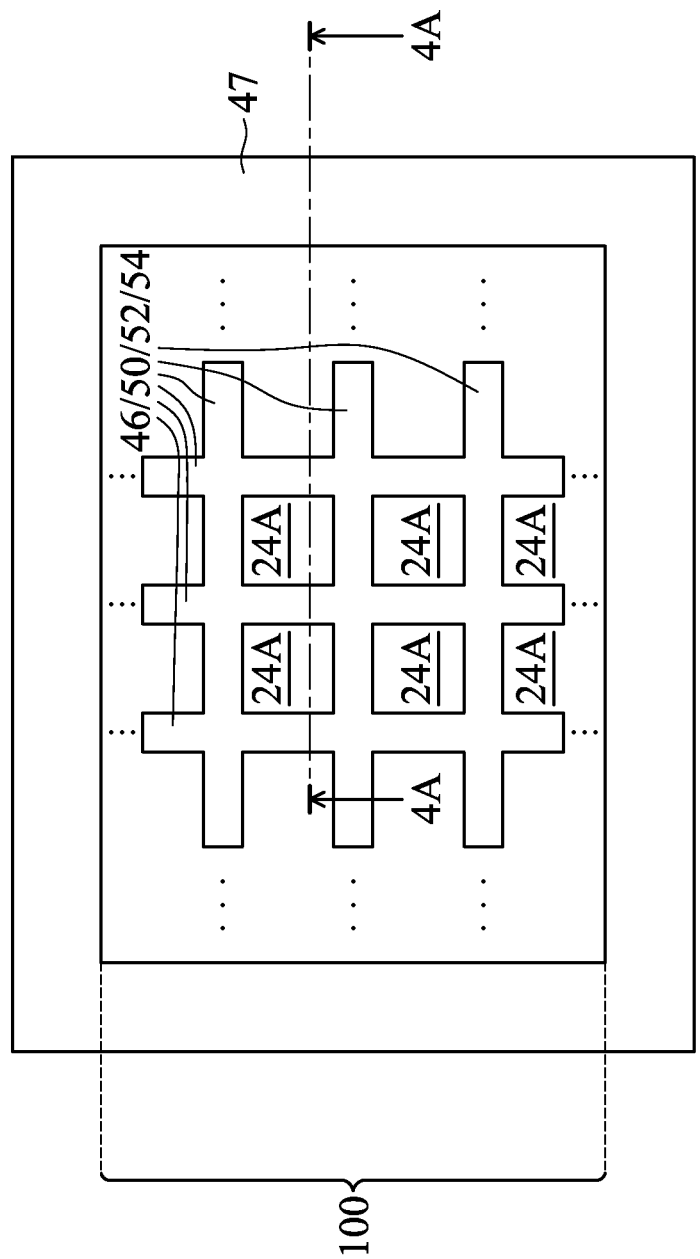

FIGS. 3, 4A, and 4B illustrate the formation of a coating on grid lines 46, wherein the coating includes stacked layers. Referring to FIG. 3, the coating including adhesion layer 50, oxide layer 52, and high-refractive index layer 54 is formed. Throughout the description, adhesion layer 50 and oxide layer 52 are in combination referred to as a high light-reflective layer. Each of layers 50, 52, and 54 may be a substantially conformal layer, with the vertical portions have substantially the same thicknesses as the horizontal portions of the respective layers. In some embodiments, adhesion layer 50 is a chromium layer, although other metals that have good adhesion to grid lines 46 can also be used. In accordance with some exemplary embodiments, the weight percentage of chromium in adhesion layer 50 may be greater than about 95 percent, and may be greater than about 99 percent, although a lower percent is also applicable. Thickness T2 of adhesion layer 50 may be between about 50 Å and about 200 Å in some exemplary embodiments.

In accordance with some exemplary embodiments, oxide layer 52 includes the oxide of the metal that is used in adhesion layer 50. Alternatively, oxide layer 52 may include an oxide of a metal that is not used in adhesion layer 50. In the embodiments wherein adhesion layer 50 comprises chromium, oxide layer 52 may comprise chromium oxide. Thickness T3 of oxide layer 52 may be greater than about 100 Å, and may be between about 50 Å and about 500 Å in some exemplary embodiments.

In some embodiments, the formation of adhesion layer 50 and oxide layer 52 includes depositing adhesion layer 50, for example, using Physical Vapor Deposition (PVD). In a subsequently performed treatment step, the deposited adhesion layer 50 is treated in an oxygen-containing environment, so that a top layer of adhesion layer 50 is oxidized to form oxide layer 52. The respective process gases include an oxygen-containing gas such as oxygen ($O_2$), ozone ($O_3$), or the like. The bottom layer of the deposited adhesion layer 50 is not oxidized. The treatment step may include a plasma treatment, wherein the oxygen-containing gas is conducted into a process chamber, in which the plasma is generated from the oxygen-containing gas. The treatment may also include a thermal treatment, wherein the plasma may be turned on or turned off. In the thermal treatment, the temperature of adhesion layer 50 may be between about 25° C. and about 400° C.

In alternative embodiments, the formation of adhesion layer 50 and oxide layer 52 is performed in the same process chamber (not shown), with both adhesion layer 50 and oxide layer 52 being deposited. For example, adhesion layer 50 is first deposited using PVD. During the deposition of adhesion layer 50, no oxygen-containing gas is introduced into the process chamber. Next, without a vacuum break, the oxygen-containing gas is introduced into the process chamber, and the deposition is continued, wherein the same PVD target is used in the deposition of both adhesion layer 50 and oxide layer 52. Accordingly, oxide layer 52, which comprises the oxide of the same metal that is in adhesion layer 50, is formed.

High-refractive index layer 54 may have a refractive index (n value) greater than about 1.5, or greater than about 2.0. In some embodiments, high-refractive index layer 54 is formed of silicon-rich oxide, which has a refractive index greater than about 1.5. The adjustment of the refractive index into the desirable range may be achieved by increasing the silicon percentage in high-refractive index layer 54. In alternative embodiments, high-refractive index layer 54 comprises a high-k dielectric material, which has a refractive index greater than 2.0. The exemplary high-k dielectric materials include hafnium oxide, lanthanum oxide, tantalum oxide, and combinations thereof. Thickness T4 of high-refractive index layer 54 may be between about 100 Å and about 1,000 Å, for example.

Referring to FIGS. 4A and 4B, which are a cross-sectional view and a top view, respectively, adhesion layer 50, oxide layer 52, and high-refractive index layer 54 are patterned. The remaining portions of layers 50, 52, and 54 include first portions on the top surfaces and sidewalls of grid lines 46, and a second portion in black reference pixel region 200. The second portion may further include a top portion over metal shield 47, and sidewall portions on the sidewalls of metal shield 47. The horizontal portions of layers 50, 52, and 54 that are aligned to active image sensors 24A are removed. FIG. 4B further illustrates the top view of the structure shown in FIG. 4A, wherein the cross-sectional view shown in FIG. 4A is obtain from the plane crossing line 4A-4A in FIG. 4B. In some embodiments, metal shield 47 forms a ring encircling active image sensor pixel region 100. Active image sensors 24A are observed in the openings defined by grid lines 46 and the respective overlying remaining portions of layers 50, 52, and 54.

Figure 5:
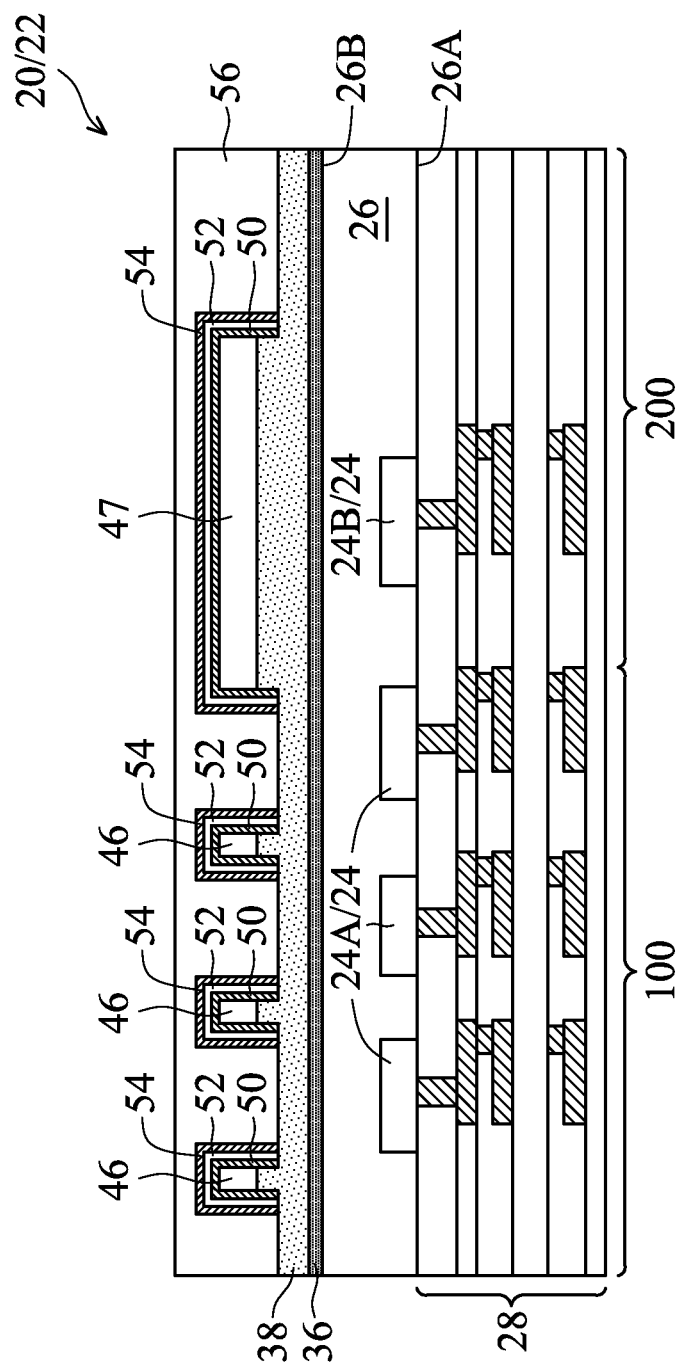

FIG. 5 illustrates the formation of oxide layer 56, which is a dielectric layer. In some embodiments, oxide layer 56 is a silicon oxide layer formed using PECVD. In some embodiments, a planarization step such as a Chemical Mechanical Polish (CMP) is performed to level the top surface of oxide layer 56. Oxide layer 56 fills grid openings 48, and may further include portions over grid lines 46.

Figure 6:
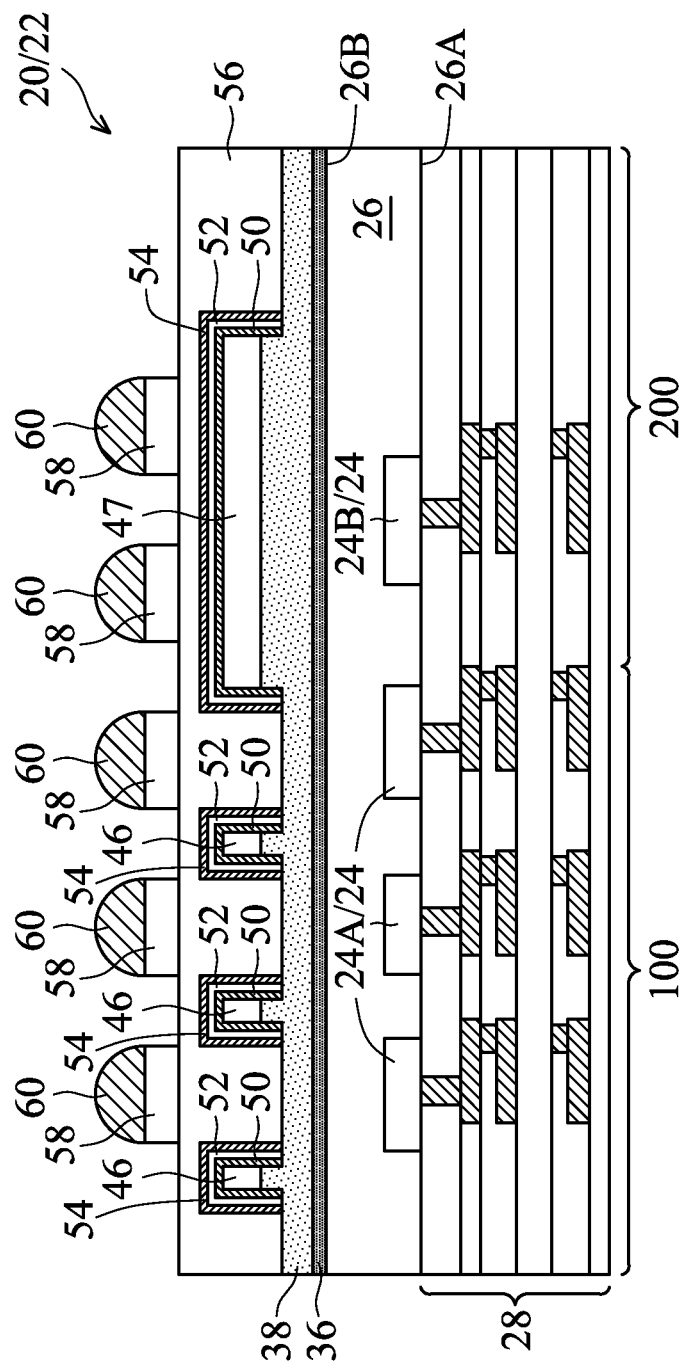

In subsequent process steps, as shown in FIG. 6, additional components such as color filters 58 and micro-lenses 60 are formed, with each of active image sensors 24A aligned to one of color filters 58 and one of micro-lenses 60. In some embodiments, oxide layer 56 has a refractive index smaller than the refractive index of high-refractive index layer 54. The difference between the refractive index of high-refractive index layer 54 and oxide layer 56 may be greater than about 0.5, for example. The refractive index of oxide layer 56 may also be lower than 1.5.

Figure 7:
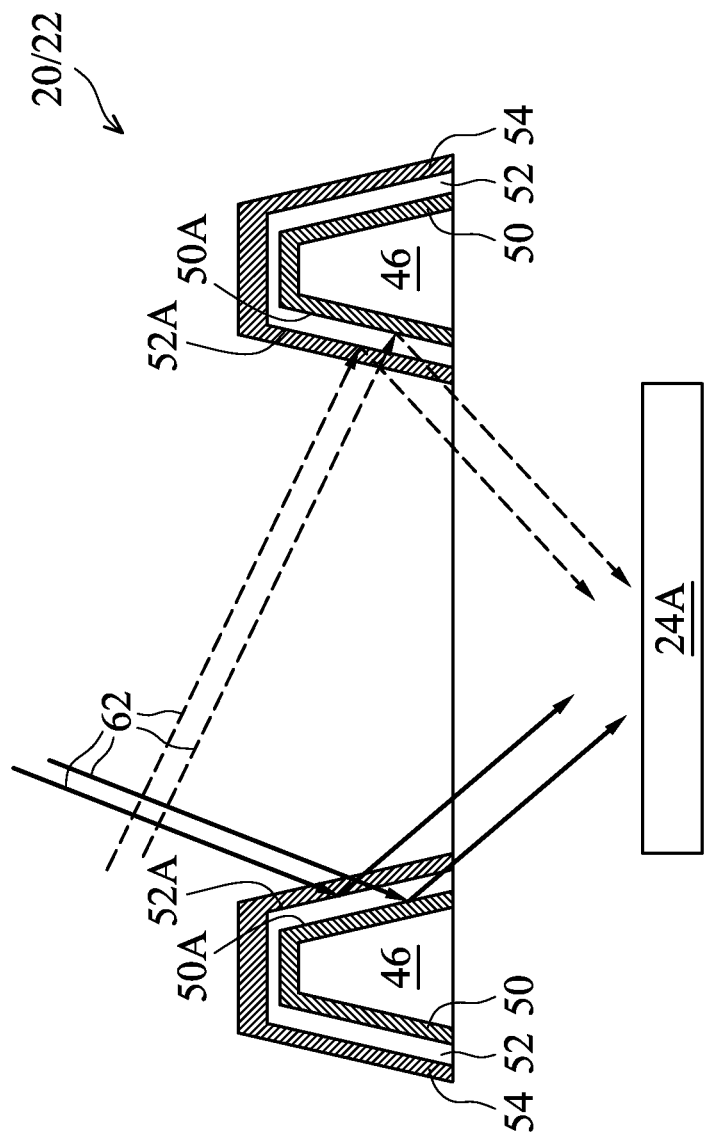
FIG. 7 schematically illustrates the light paths on the grid structure.

FIG. 7 illustrates an amplified view of grid lines 46 and the overlying layers 50, 52, and 54. Arrows 62 represent exemplary incident light rays. Surfaces 52A of oxide layer 52 reflect light 62. The portion of the light that penetrates into oxide layer 52 is further reflected on surfaces 50A of adhesion layer 50. In some embodiments, the overall reflectivity on the surfaces 50A and 52A is greater than 95 percent, and may be greater than 98 percent. Adhesion layer 50 and oxide layer 52 thus in combination act as a high light-reflective layer. Accordingly, there is a great amount of light reflected and received by the respective active image sensors 24A. The quantum efficiency is thus improved. Furthermore, with a great portion of light rays 62 being reflected on the surfaces of oxide layers 52 and adhesion layers 50, a smaller portion of the light ray may penetrate through grid lines 46 to reach neighboring grids. The optical cross-talk is thus reduced, and the signal-to-noise ratio is increased.

Referring back to FIG. 6, layers 50, 52, and 54 are also formed in black reference pixel region 200. Accordingly, layers 50, 52, and 54 and the underlying metal shield 47 has improved ability for preventing light to penetrate through.

In accordance with embodiments, a device includes a semiconductor substrate having a front side and a backside. A photo-sensitive device is disposed on the front side of the semiconductor substrate. A grid that has sidewalls and a top surface are disposed on the backside of, and overlying, the semiconductor substrate. The device further includes a high light-reflective layer, and a high-refractive index layer over the high light-reflective layer, wherein the high light-reflective layer and the high-refractive index layer extend on top surfaces and sidewalls of the grid.

In accordance with other embodiments, a device includes a semiconductor substrate having a front side and a backside, a plurality of grid lines on the backside of the semiconductor substrate and forming a plurality of grids, and a plurality of photo-sensitive devices underlying and aligned to grid openings between the plurality of grid lines. The plurality of photo-sensitive devices is at the front side of the semiconductor substrate, and is configured to receive light from the backside of the semiconductor substrate and convert the light to an electrical signal. A chromium layer includes top surface portions on top surfaces of the plurality of grid lines, and sidewall portions on sidewalls of the plurality of grid lines. A chromium oxide layer includes top surface portions and sidewall portions on the top surface portions and the sidewall portions, respectively, of the chromium layer. The device may further include a high-refractive index layer comprising top surface portions and sidewall portions on the top surface portions and the sidewall portions, respectively, of the chromium oxide layer.

In accordance with yet other embodiments, a method includes forming a plurality of photo-sensitive devices on a front side of a semiconductor substrate, forming a grid layer on a backside of the semiconductor substrate, and patterning the grid layer to form a plurality of grid lines, wherein grid openings between the plurality of grid lines are aligned to the plurality of photo-sensitive devices. A stacked layer is formed on top surfaces and sidewalls of the plurality of grid lines. The step of forming the stacked layer includes forming an adhesion layer, forming a metal oxide layer over the adhesion layer, and forming a high-refractive index layer over the metal oxide layer. The stacked layer is patterned to remove portions of the stacked layer aligned to the plurality of photo-sensitive devices.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having a front side and a backside;
    a first photo-sensitive device disposed on the front side of the semiconductor substrate;
    a grid having sidewalls and a top surface disposed on the backside of, and overlying, the semiconductor substrate;
    a high light-reflective layer; and
    a high-refractive index layer over the high light-reflective layer, wherein the high light-reflective layer and the high-refractive index layer extend on top surfaces and sidewalls of the grid.

2. The device of claim 1, wherein the first photo-sensitive device is underlying and aligned to a space between the grid.

3. The device of claim 1, wherein the high light-reflective layer comprises:
    an adhesion layer; and
    a metal oxide layer over the adhesion layer, wherein metal oxide layer comprises an oxide of a metal that is in the adhesion layer.

4. The device of claim 1, wherein at least a portion of the first photo-sensitive device is not overlapped by the high-refractive index layer.

5. The device of claim 1, wherein the high light-reflective layer comprises a top surface portion overlapping grid lines of the grid.

6. The device of claim 1, wherein the high-refractive index layer comprises silicon oxide, and has a refractive index greater than 1.5.

7. The device of claim 1, wherein the high-refractive index layer comprises a high-k dielectric material, and has a refractive index greater than about 2.0.

8. The device of claim 1 further comprising:
    a second photo-sensitive device disposed on the front side of the semiconductor substrate; and
    a metal shield over and aligned to the second photo-sensitive device, wherein the metal shield is formed of a same material as, and is at substantially a same level as, the grid.

9. A device comprising:
    a semiconductor substrate having a front side and a backside;
    a plurality of grid lines on the backside of the semiconductor substrate and forming a plurality of grids;
    a plurality of photo-sensitive devices underlying and aligned to grid openings between the plurality of grid lines, wherein the plurality of photo-sensitive devices is at the front side of the semiconductor substrate, and is configured to receive light from the backside of the semiconductor substrate and convert the light to an electrical signal;
    a chromium layer comprising top surface portions on top surfaces of the plurality of grid lines, and sidewall portions on sidewalls of the plurality of grid lines; and
    a chromium oxide layer comprising top surface portions and sidewall portions on the top surface portions and the sidewall portions, respectively, of the chromium layer.

10. The device of claim 9 further comprising a high-refractive index layer comprising top surface portions and sidewall portions on the top surface portions and the sidewall portions, respectively, of the chromium oxide layer.

11. The device of claim 10, wherein at least a portion of each of the plurality of photo-sensitive devices is not overlapped by the high-refractive index layer.

12. The device of claim 9, wherein the top surface portions of the chromium layer are directly over and overlap the plurality of grid lines.

13. The device of claim 9, wherein the chromium oxide layer is in contact with the chromium layer.

14. The device of claim 9 further comprising:
   an image sensor disposed on the front side of the semiconductor substrate; and
   an metal shield over and aligned to the image sensor, wherein the metal shield is formed of a same material as, and is at substantially a same level as, the plurality of grid lines, and wherein the chromium layer and the chromium oxide layer extend on a top surface and sidewalls of the metal shield.

15. A device comprising:
   a semiconductor substrate having a front side and a backside;
   a first photo-sensitive device disposed on the front side of the semiconductor substrate;
   a metal grid having sidewalls and a top surface disposed on the backside of, and overlying, the semiconductor substrate;
   a high light-reflective layer comprising:
      a metal adhesion layer extending on top surfaces and sidewalls of the metal grid; and
      a metal oxide layer over the metal adhesion layer, wherein the metal oxide layer comprises an oxide of a metal that is in the metal adhesion layer; and
   a high-refractive index layer over the high light-reflective layer, wherein the high-refractive index layer has a refractive index greater than 1.5.

16. The device of claim 15, wherein the first photo-sensitive device is underlying and aligned to a grid opening of the metal grid, and wherein at least a portion of the first photo-sensitive device is not overlapped by the high-refractive index layer.

17. The device of claim 15, wherein the metal adhesion layer comprises chromium, and wherein the metal oxide layer comprises chromium oxide.

18. The device of claim 15, wherein the metal grid comprises a titanium nitride layer, and a tungsten layer over the titanium nitride.

19. The device of claim 15, wherein the high light-reflective layer comprises a top surface portion overlapping grid lines of the metal grid.

* * * * *